United States Patent
Patel et al.

(10) Patent No.: US 6,550,263 B2
(45) Date of Patent: Apr. 22, 2003

(54) SPRAY COOLING SYSTEM FOR A DEVICE

(75) Inventors: Chandrakant D. Patel, Fremont, CA (US); Cullen E. Bash, San Francisco, CA (US)

(73) Assignee: HP Development Company L.L.P., Houston, TX (US)

( * ) Notice: Subject to any disclaimer, the term of this patent is extended or adjusted under 35 U.S.C. 154(b) by 0 days.

(21) Appl. No.: 09/945,045

(22) Filed: Aug. 31, 2001

(65) Prior Publication Data

US 2002/0113142 A1 Aug. 22, 2002

Related U.S. Application Data

(60) Provisional application No. 60/271,275, filed on Feb. 22, 2001.

(51) Int. Cl.[7] ............................................... F25D 23/12
(52) U.S. Cl. .................. 62/259.2; 62/132; 165/80.4; 361/699
(58) Field of Search ........................... 62/132, 118, 119, 62/259.2; 165/80.4, 104.33; 361/689, 698, 699

(56) References Cited

U.S. PATENT DOCUMENTS

| 2,643,282 A | 6/1953 | Greene ........................ 174/15 |
| 2,849,523 A | 8/1958 | Narbut ........................ 174/15 |
| 2,858,355 A | 10/1958 | Narbut ........................ 174/15 |
| 2,875,263 A | 2/1959 | Narbut ........................ 174/15 |
| 4,141,224 A | 2/1979 | Alger et al. ............... 62/514 R |
| 4,290,274 A | 9/1981 | Essex ........................... 62/157 |
| 4,352,392 A | 10/1982 | Eastman ................. 165/104.25 |
| 4,490,728 A | 12/1984 | Vaught et al. ............... 346/1.1 |
| 4,500,895 A | 2/1985 | Buck et al. ............. 346/140 R |
| 4,559,789 A | 12/1985 | Riek ............................ 62/157 |
| 4,576,012 A | 3/1986 | Luzenberg ................... 62/157 |
| 4,683,481 A | 7/1987 | Johnson .................. 346/140 R |
| 4,685,308 A | 8/1987 | Welker et al. ................ 62/171 |
| 4,794,410 A | 12/1988 | Taub et al. ............. 346/140 R |
| 5,220,804 A | 6/1993 | Tilton et al. ................... 62/64 |
| 5,278,584 A | 1/1994 | Keefe et al. ............ 346/140 R |
| 5,434,606 A | 7/1995 | Hindagolla et al. ........... 347/45 |
| 5,718,117 A | 2/1998 | McDunn et al. ............... 62/64 |
| 5,724,824 A | 3/1998 | Parsons ........................ 62/171 |
| 5,907,473 A | 5/1999 | Prizilas et al. .............. 361/699 |
| 5,924,198 A | 7/1999 | Swanson et al. ........... 29/890.1 |
| 5,943,211 A | 8/1999 | Havey et al. ............... 361/699 |
| 6,108,201 A | 8/2000 | Tilton et al. ................ 361/689 |
| 6,182,742 B1 | 2/2001 | Takahashi et al. ...... 165/104.33 |
| 6,205,799 B1 | 3/2001 | Patel et al. .................... 62/132 |

OTHER PUBLICATIONS

Sehmbey, M.S., Pais, M.R. and Chow, L.C., "Effect of Surface Material Properties and Surface Characteristics in Evaporative Spray Cooling," The Journal of Thermophysics & Heat Transfer, Jul.–Sep., 1992, vol. 6, No. 3, pp 505–511.

(List continued on next page.)

Primary Examiner—Melvin Jones (57) ABSTRACT

A semiconductor chip cooling system having a body that forms a cavity configured to create a spray chamber when conformingly adjoined to a chip, or to a substrate or printed circuit board carrying one or more chips. The cooling system uses thermal inkjet sprayers to spray the chip(s) in the spray chamber with cooling fluid. The cooling system includes a combined reservoir and condenser. Liquid and gaseous cooling fluid travel or are pumped from the spray chamber to the reservoir. A controller transmits a control signal to the sprayer to cause the sprayer to spray at a rate leading to the cooling fluid being vaporized by the semiconductor device.

29 Claims, 4 Drawing Sheets

OTHER PUBLICATIONS

Pais, Martin R., Chang, Ming J., Morgan, Michael J. and Chow, Louis C., Spray Cooling of a High Power Laser Diode, SAE Aerospace Atlanta Conference & Exposition, Dayton, Ohio, 1994, pp 1–6.

Morgan, Michael J., Chang, Won S., Pais, Martin R. and Chow, Louis C., "Comparison of High Heat–Flux Cooling Applications," SPIE, 1992, vol. 1739, pp 17–28.

Lee, Chin C., andChien, David H., "Thermal and Package Design of High Power Laser Diodes," IEEE, 1993, Ninth IEEE Semi–Therm Symposium, pp 75–80.

Sehmbey, Mainder S., Chow, Louis C., Pais, Martin R. and Mahefkey, Tom, "High Heat Flux Spray Cooling of Electronics," American Institute of Physics, Jan., 1995, pp 903–909.

Mudawar, I. and Estes, K.A., "Optimizing and Predicting CHF in Spray Cooling of a Square Surface," Journal of Heat Transfer, Aug., 1996, vol. 118, pp 672–679.

SPRAY COOLING SYSTEM FOR A DEVICE

The present application claims priority from U.S. provisional patent application, Serial No. 60/271,275, filed Feb. 22, 2001, which is incorporated herein by reference for all purposes.

The present invention relates generally to cooling systems for heat-generating devices and, more particularly, to a spray cooling system and a method of using the spray cooling system to cool one or more semiconductor devices (i.e., chips).

BACKGROUND OF THE INVENTION

With the advent of semiconductor devices having increasingly large component densities, the removal of heat generated by the devices has become an increasingly challenging technical issue. In the last decade, the frequency of operation of CMOS devices has increased by an order of magnitude. The resulting microprocessor power dissipation has likewise gone up by an order of magnitude. While the input voltage and capacitance of devices has decreased, the number of devices on a typical microprocessor die continues to increase rapidly as processing efficiency is sought. Moreover, device miniaturization has led device designers to integrate previously separate components, such as those used to create a cache, into the microprocessor die.

This consolidation of devices has resulted in high CPU core power density—e.g., 50% of a 20 mm by 20 mm microprocessor die may contain the CPU core, with the rest being cache. Extrapolating the changes in microprocessor organization and the device miniaturization, one can project future power dissipation requirements of 100 W from a 1 cm by 1 cm core CPU surface area within the easily foreseeable future. Furthermore, typical processor boards can, in some instances, include multiple CPU modules, application-specific integrated circuits (ICs), and static random access memory (SRAM), as well as a dc-dc converter, all of which have increasing power dissipation requirements, thereby increasing the total power dissipation level needed by computer systems.

Adding to the complexity, modern systems using such high-dissipation chips frequently have a variety of chips requiring different levels of cooling, only some of which are extreme. Depending on an electronic system's design, components containing these chips can be located throughout a system, and might not be easily dealt with using either simple cooling means, or using cost-efficient high-dissipation cooling means directed only to the chips requiring their capabilities.

Heat sinks can be used to increase the heat-dissipating surface area of heat-producing devices. However, heat sinks, are typically characterized by a mechanical interface to their cooled devices, which commonly leads to interference in the heat flow, and can lead to very high thermal resistance. Indeed, the bulk of the available thermal budget for cooling, typically a 45° C. temperature differential between the chip temperature and the ambient temperature, will commonly be used up by this interface. The mechanical interface can also lead to uneven cooling. This is further complicated by the non-uniform power distribution on many chips, which often results when different components are integrated onto a single chip.

To deal with these difficulties, innovative ways have been developed to reduce chip-to-heat sink thermal resistance. Included among the cooling methods for semiconductors are free-flowing and forced-air convection, free-flowing and forced-liquid convection, pool boiling (i.e., boiling a liquid cooling fluid off of a submerged device), and spray cooling (i.e., boiling a liquid cooling fluid off of a device being sprayed with the liquid). Because liquids typically have a high latent heat of vaporization, these latter two methods provide for a high heat-transfer efficiency, absorbing a large quantity of heat at a constant temperature.

The use of these boiling/vaporizing methods is limited to a maximum power density, the critical heat flux (CHF). At higher densities, the vaporized cooling fluid forms a vapor barrier insulating the device from the liquid cooling fluid, thus allowing the wall temperature of the device to increase greatly. This phenomenon is referred to as dry-out. When a coolant is properly sprayed, it can disperse such a vapor layer, and its CHF can be well over an order of magnitude higher than the CHF of a pool-boiling system. This high CHF is preferably a uniform spray, and should match the power dissipation requirements of the device. Thus, spray cooling presently provides the most efficient cooling for a heat-generating device, such as a semiconductor device.

Typically, the cooling fluid used for spray cooling has a relatively low boiling point (in relation to the operating temperature of the device), which is the temperature that the sprayed device is cooled toward. Most preferably, the cooling fluid is inert to the heat source. For semiconductor devices, low boiling point fluids such as 3M® FC-72 (FED. CIR.-72, i.e., FLUORINERT®, sold by 3M® Corporation), 3M's Novec line of fluids (HFE 7100, etc., sold by 3M® Corporation) or PF-5060 are among a number of known suitable cooling liquids.

The nozzle design is a key component of spray cooling. Pressure assisted and gas assisted nozzles are known designs. However, these types of nozzles are limited in their ability to control the rate at which they spray. Therefore, they can cause "pooling" (i.e., a buildup of liquid on the cooled device due to excessive spray rates). Also, a fine, localized control of the spray rate, direction and/or location is not generally available.

For pressure-assisted spraying, consistent, controlled spraying requires one or more high pressure pumps that provide a precise pressure to pump the liquid through a nozzle, even at varying flow rates. Both the distribution and the flow rate of the sprayed liquid can change with variations in the driving pressure and/or small variations in the nozzle construction. Thus, the cooling system is a sensitive and potentially expensive device that can be a challenge to control.

For gas atomizing, consistent, controlled spraying requires a pressurized gas that is delivered to a spray head design in a precise manner. Because the gas must be pressurized separately from the cooling fluid, such systems are not typically closed systems. The gas must be bled out for the condenser to run efficiently. Furthermore, both the distribution and the flow rate of the cooling fluid can change with variations in the gas pressure. Thus, the cooling system is a sensitive and potentially expensive device that can be a challenge to control.

Typically, current sprayer designs employ either pressurized liquid spraying or pressurized gas atomizing. A number of factors affect the performance of spray cooling, thus affecting the heat transfer coefficient h and/or the CHF. It is commonly understood that surface roughness and wettability of the sprayed component are two of these factors, and the orientation of the surface being sprayed can be a third. In particular, it is believed that h is higher for rough surfaces when using a pressurized liquid spray, and for smooth surfaces when using gas atomizing. Surfaces with decreased wettability appear to have a marginal increase in h.

Critical to consistent, controlled cooling is the controlled application of the liquid cooling fluid in a desired distribution, flow rate, and velocity. For example, at a low mass flow rate, CHF and h increase with the mass flow rate. However, at a critical mass flow rate, the advantages of increased mass flow are diminished due to pooling and/or due to a transition to single phase heat transfer. Thus, a spray cooling system is preferably operated uniformly at a mass flow rate defined at a point before the critical mass flow rate is reached. All of these factors make critical the design of the sprayer, i.e., the design of the nozzle and its related spray devices.

Also important to the cooling system design is its operating temperature. In particular, it is desirable to configure the system to operate at a high h, which will occur with a design temperature above the boiling temperature and below a temperature that will dry out the sprayed coolant. The amount of heat to be dissipated must be less than the CHF.

Typically, in implementing a spray cooling system, a spray cooling sprayer is mounted within a container that also contains a printed circuit board carrying one or more chips. The printed circuit board has leads that electrically connect to systems outside of the container via air- and water-tight connections. Such systems can be large, and can be expensive to build and maintain.

Accordingly, there has existed a need for a small, accurate, reliable and cost-efficient spray cooling system that can be used to support complex processing systems having one or more high-dissipation devices. The present invention satisfies these and other needs, and provides further related advantages.

SUMMARY OF THE INVENTION

In various embodiments, the present invention solves some or all of the needs mentioned above by providing a package-level cooling system that efficiently operates on a package of one or possibly more high-dissipation devices with spacial and cost efficiency.

The system for cooling a semiconductor device with a cooling fluid, of the invention, features a body configured to be retained against a portion of a package, which may be a component made of one or more exposed semiconductor devices (i.e., chips) on a component substrate, a component made of one or more chips on a component substrate covered by an encapsulant or lid, or even one or more exposed or covered components mounted on a component substrate such as a printed circuit board. The body is configured to form a spray chamber in which the cooling fluid can be sprayed into thermal contact with a portion of the chip(s), either directly or indirectly. Advantageously, designs embodying this feature typically provide for simple assembly of the cooling system and the semiconductor device, and take up little space.

The invention also features the use of incremental sprayers, being configured to eject incremental amounts of cooling fluid onto the chips in response to a control signal. These incremental sprayers are preferably of a thermal inkjet-type design, typically providing evaporative cooling by a continuous "mist" on a high-power dissipation-surface. This feature can provide for excellent flow rate control in most designs, as well as operating reliably with few or no mechanical movements in the spray system.

An integral condenser and reservoir, configured to receive and cool (i.e., remove heat from) cooling fluid from an outlet of the spray chamber, and configured to feed cooling fluid to an inlet of the sprayer, is also featured in the invention. Advantageously, this feature can provide for a more self-contained system that does not rely on thermodynamic mechanisms of the processing system. It can also provide for cost and spacial efficiency in the manufacture and use of the cooling system.

Other features and advantages of the invention will become apparent from the following detailed description of the preferred embodiments, taken in conjunction with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read in conjunction with the accompanying drawings. This detailed description of particular preferred embodiments of the invention, set out below to enable one to build and use particular implementations of the invention, is not intended to limit the enumerated claims, but rather it is intended to provide particular examples thereof.

Evaporative spray cooling promises to be a technology that can deliver high performance cooling. An objective of spray cooling is for a device's wall-temperature to achieve a value close to a coolant's saturation temperature. For example, a vaporization of low boiling point fluid such as 3M® FC-72, having a boiling point of 56° C. can achieve a chip wall temperature close to 70° C. Such a wall temperature might be necessary to keep a device's junction temperature at 85° C. This need to keep the chip wall temperature at 70° C. stems from the typically irregular distribution of power on a chip. The high power densities, reaching 200 W/cm$^2$, for a 50 W source distributed over 0.5 cm by 0.5 cm, cannot easily be addressed by conventional mechanical interfacing means.

Figure 1:
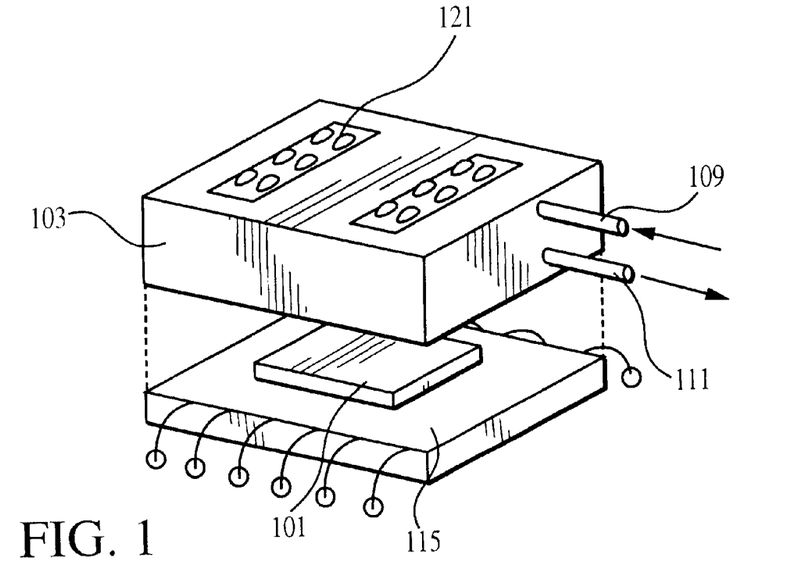
FIG. 1 is an exploded, perspective view of a cooling system embodying the invention.
Figure 2:
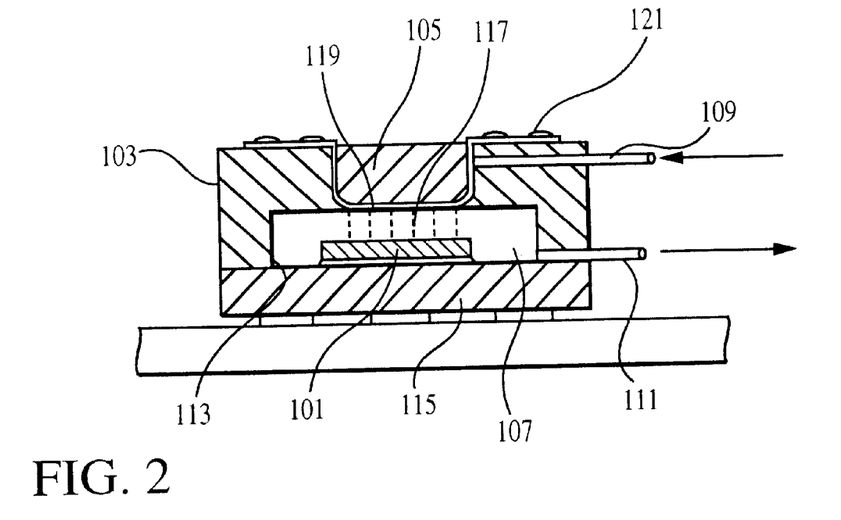
FIG. 2 is a cross-sectional, left side elevational view of the cooling system depicted in FIG. 1.

With reference to FIGS. 1 and 2, the first embodiment of a cooling system is for cooling a component including one or more devices such as chips 101 composed of heat-generating semiconductor devices. The cooling system includes a body forming a cooling cap 103, and one or more spray mechanisms 105. The cap and spray mechanism are preferably integrated into a single cooling assembly. The cap is configured to form a spray chamber 107 in which cooling fluid can be sprayed into thermal contact with, and preferably directly onto, the chip. The spray mechanism includes an inlet 109 for receiving cooling fluid, preferably in a liquid state. An outlet 111 for liquid and/or gaseous cooling fluid preferably extends from the spray chamber.

Preferably, the cap 103 includes a concave portion having surfaces 113 that form a cavity configured to conformingly adjoin to one or more surfaces of a component substrate 115 that is both electrically connected to and carrying the chips 101. Here, the component substrate and chips form a package with which the cap is associated. The package is preferably in the conventional form of an integrated circuit component that has not received an encapsulant or lid.

When the cavity of the cap conformingly adjoins the component substrate, the spray chamber 107 is formed, containing at least the portions of the semiconductor devices to be spray cooled. The cap is preferably made of a material having a thermal coefficient of expansion substantially matching that of the component substrate. Preferably, the cap is retained against the component substrate by an adhesive, a clamping mechanism, fasteners, or other attachment-type mechanisms, and a seal is formed such that liquid and vapor cooling fluid do not escape the spray chamber other than through designed orifices. The component substrate is preferably configured to be vapor and liquid tight, but could be configured with a designated orifice, such as an outlet. The cap forms a package-level cooling system to be affixed to the package and thereby form a cooled package.

The spray mechanism 105 is configured to spray cooling fluid 117 onto the one or more chips 101, which heat and vaporize some, or more preferably all, of the cooling fluid. The cooling fluid vapor that forms during the cooling process is retained in an enclosed spray chamber 107 around the chips.

Preferably, the spray mechanism 105 is an incremental sprayer configured to eject an incremental amount of the cooling fluid on the chips. The cooling fluid is typically sprayed in response to an energizing control signal, which is sent to the sprayer by a controller. The quantity of liquid sprayed from incremental sprayers can be highly controllable, such as by controlling the rate at which incremental amounts of cooling fluid are ejected.

For example, by increasing or decreasing the frequency that the incremental sprayers are energized, the flow rate can be accurately adjusted. Furthermore, because the sprayers can be configured to deliver very small quantities of cooling fluid, and because a large number of sprayers can be fit into a small area, the heat distribution over that area can be accurately controlled by energizing some of the sprayers at a rate greater than that of other sprayers. These features provide for accurate delivery of cooling fluid at precise and controllable rates. Furthermore, incremental sprayers can be modular, offering quickly and easily replaceable units.

A preferred type of incremental sprayer for the spray mechanism 105 is to an inkjet-type sprayer. In particular, with reference to FIGS. 2 and 3, the spray mechanism includes a nozzle plate 119 that forms a plurality of thermal inkjet sprayers ("TIJ sprayers"). The nozzle plate is located on the cavity of the cap 103 so as to direct spray toward the chip 101 through the spray chamber 107. The nozzle plate can be incorporated in a TIJ sprayer head, as is known in inkjet spray technology.

Figure 3:
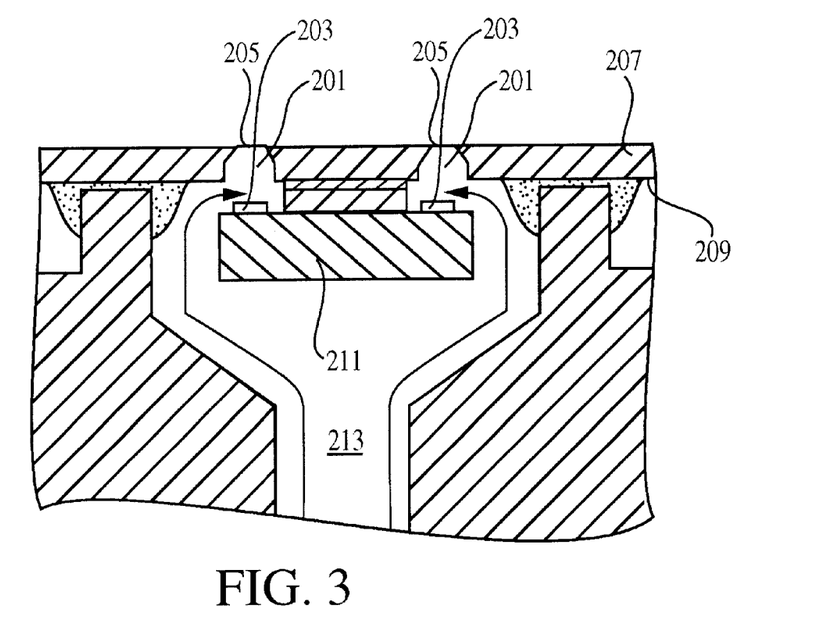
FIG. 3 is a cross-sectional view of a pair of incremental sprayers as used in the cooling system depicted in FIG. 1.

As depicted in FIG. 3 (showing two TIJ sprayers), each TIJ sprayer includes structure defining an ejection chamber 201 for receiving a predetermined portion of cooling fluid, and a heater 203 for vaporizing a sub-portion of the predetermined portion cooling fluid to create the pressure to eject an incremental amount of cooling fluid through an orifice 205 that directs the ejected cooling fluid toward the chip 101 (FIG. 2). The orifices are preferably formed in a flexible polymer tape 207, e.g., a polyimide tape such as is sold under the mark KAPTON.®

Affixed to a back surface 209 of the tape 207 is a silicon substrate 211 containing the heaters 203, in the form of individually energizable thin-film resistors. Each heater is preferably located on a side of the ejection chamber 201 across from the ejection chamber's orifice 205. Cooling fluid is preferably drawn and loaded into the ejection chamber by capillary action from a passage 213, as is typical for an ink-jet type device. Preferably, a computerized controller (not shown) energizes the heater, vaporizing the portion of the cooling fluid adjacent to the heater. The vaporized cooling fluid expands, expelling most of the non-vaporized cooling fluid out of the orifice, typically in the form of a single droplet.

With reference to FIGS. 1-3, the computerized controller is electrically connected to the heater via a plurality of contacts 121 mounted on the cap 103. The contacts are preferably integrated in the cap and exposed on its exterior. This can be done by the use of a flex circuit connection, or in the case of ceramic cap, the electrical connections can be routed in ceramic. Optionally, the controller could be based in the chips that are being cooled and signals routed through the component substrate 115 and cap via a connector (not shown).

Depending on the configuration of the sprayer 105, the incremental amount of the fluid sprayed from the sprayer could be in the form of a single droplet, or in the form of multiple droplets. Multiple droplets could be produced by multiple orifices related to a single heater, or by sprayers having larger ejection chambers 201 and/or appropriately shaped orifice nozzles to cause the incremental amount of fluid to break into droplets. After an ejection chamber 201 has been fired by the heater 203, capillary action again loads the ejection chamber for a subsequent firing.

The incremental sprayers can alternatively be based on other types of ink-jet droplet expelling technology, such as piezoelectric technology (i.e., piezoelectric nozzles). Examples of this technology are discussed in numerous U.S. Patents, including U.S. Pat. Nos. 5,924,198, 4,500,895, and 4,683,481, which are incorporated herein by reference for all purposes. Other thermal ink-jet technologies can likewise be appropriate for use for inkjet spray cooling. A highly preferable cooling fluid for use with a thermal incremental sprayer is 3M® FLUORINERT®, which is adaptable to existing thermal ink-jet technology.

The spray cooling systems can feature the ejection of incremental amounts of a cooling fluid on the heat source, using the incremental sprayer, spaced over a number of time increments. Either the incremental time or the amount ejected can be varied to adjust the flow rate to an optimal level. The system can be controlled by monitoring, either directly or indirectly, the temperature of the heat source and the amount of pooling or dry-out that is occurring, if any. This can provide for optimized cooling of a heat source.

Typically, this embodiment will include a plurality of sprayers, each of which can be run at different rates depending on the heat dissipation requirements of the portion of the chip that it sprays. The cooling cap, when properly configured with appropriately positioned sprayers, can accommodate numerous chips 101 on the component substrate 115.

One or more sprayers 105 can be associated with each chip, and can be individually controlled to operate at rates that depend on the heat dissipation needs of any portion of each individual chip.

With reference to FIGS. 1 and 2, the cap preferably defines an inlet channel forming the inlet 109 and an outlet channel forming the outlet 111. These channels lead out to lines (not shown) that connect the cooling system to a source of cooling fluid ready for spraying, such as a reservoir (not shown), and a dump for vapor and/or liquid cooling fluid that has been sprayed (not shown). Preferably the dump is a cooling/condensing unit that recycles the cooling fluid back into the reservoir and/or sprayers, and more preferably it forms a closed system.

While the most preferred of these embodiments of the invention are configured to replace the existing technology cover-packages with spray caps incorporated into device packages, there can be numerous variations in the formation of the present embodiment. For example, the package can be formed such that the chip is directly spray cooled with an inert dielectric fluid, or it can be formed with the chip in some way covered such that the cover is spray cooled with any of a wide range of fluids, such as water, perhaps at a reduced pressure. Additionally, the spray cooling system can have an integrated TIJ sprayer head (i.e., it is permanently formed in the cap during the manufacturing process), or it can be separately added, and possibly be removable and replaceable in a modular form. Furthermore, additional inlets and/or outlets can be used, such as for the separate removal of liquid and gaseous cooling fluid from the spray chamber.

A useful aspect of many embodiments of the invention related to this first embodiment is that it forms an extremely compact cooling system that can be universally applicable across various types of heat-producing components in a wide array of products, from servers to workstations and beyond. Numerous cooling caps can be fed cooling fluid from a single source, which can in turn receive the vaporized cooling fluid back from the cooling caps for condensing and recycling. A single controller can be used to control a plurality of cooling systems. Preferably, each cooling cap is integrated into the package of a high-power/high-performance chip or set of chips, thereby allowing the cooling system assembly process to be simplified down to the simple attaching of cooling fluid lines to the cooled package's inlet and outlet.

Figure 4:
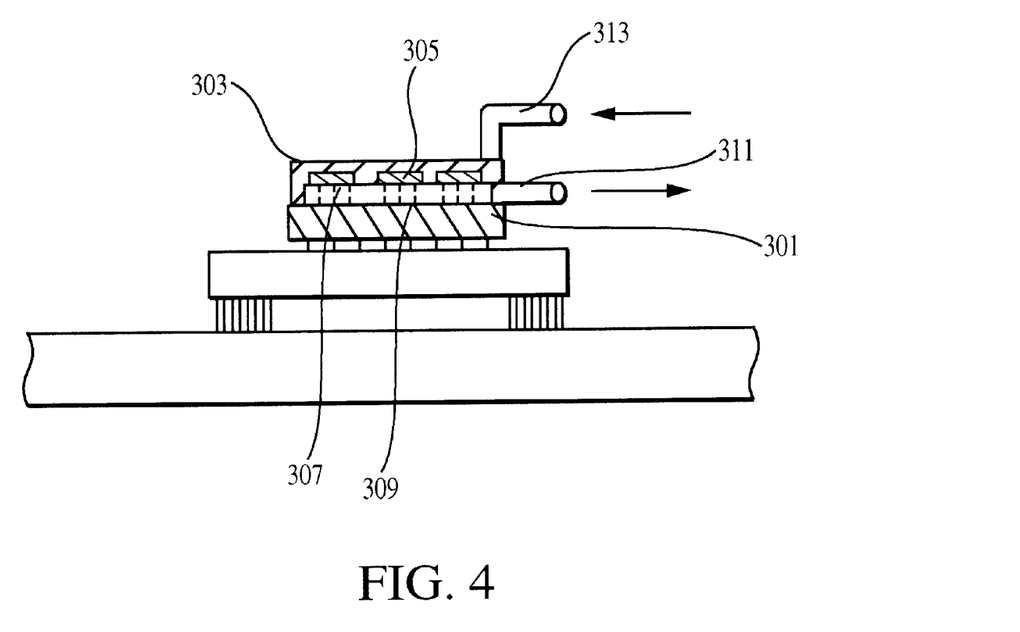
FIG. 4 is a cross-sectional view of a second cooling system embodying the invention.

With reference to FIG. 4, another embodiment of this invention is similar to the first, but it is designed with a cooling cap reconfigured for attachment to a component including a chip that has been covered with a lid or an encapsulant. In particular, a component 301, including one or more chips, receives a cap 303 that is preferably made of a material such that the cap's thermal coefficient of expansion matches the material of the component (e.g., appropriate ceramics, plastics, Si or SiC, or the like). As with the first embodiment, the cap includes one or more sprayers 305, preferably being incremental sprayers, and more preferably being an integrated TIJ spray mechanism. The cap has a concave portion 307 that forms a spray chamber when adjoined to a portion of the component, preferably being the covering for the chip.

Using the spray mechanism, the chip-covering portion 309 (i.e., the lid or encapsulant) of the component is preferably sprayed directly with coolant fluid that undergoes a complete phase change. After the phase change into vapor, the vapor is picked up through an outlet 311 and returned to a condenser that is outside the cooling cap. The condenser condenses the cooling fluid and sends it to a reservoir, which in turn returns it to the spray mechanism through an inlet 313.

Without repeating all the details of the first embodiment, it should be understood that this embodiment incorporates many unstated features of the first embodiment. For example, contacts, preferably located on an exterior of the cap, electrically connect the sprayer(s) to a controller that controls the operation of the sprayers. Likewise, the cap can be attached by any of a variety of devices as is appropriate to the limitations of the component's design. It should also be noted that components of the first and second embodiments can be combined in the same electronic device, and can be run using a common reservoir and/or condenser.

Figure 5:
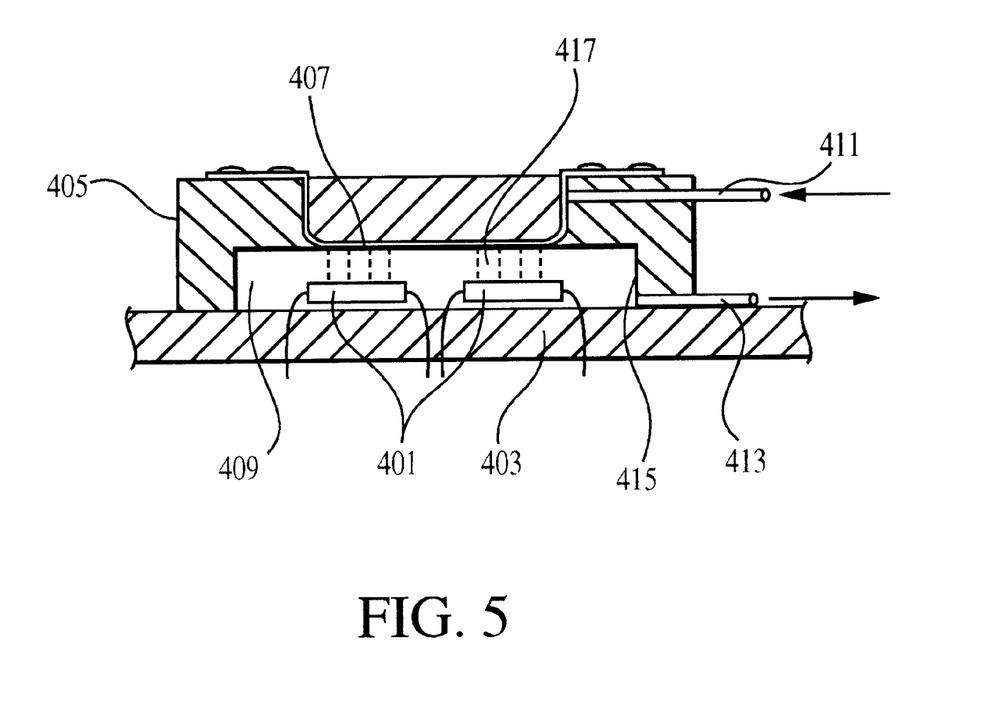
FIG. 5 is a cross-sectional view of a third cooling system embodying the invention.

With reference to FIG. 5, the third embodiment of a cooling system is for cooling one or more components 401 made from heat-generating chips on one or more component substrates, which are in turn mounted on a component-carrying substrate 403 (i.e., a substrate that receives one or more components, typically by receiving a plurality of leads from each carried component). The carried components can be covered (i.e., lidded or encapsulated) or uncovered (i.e., exposed).

The components, mounted on the component-carrying substrate, form a package to be cooled by the cooling system of the embodiment. The cooling system includes a body forming a cooling cap 405, and one or more spray mechanisms 407. The cap and spray mechanism are preferably integrated into a single cooling assembly. The cap is configured to form a spray chamber 409 in which cooling fluid can be sprayed into thermal contact with, and preferably onto, the components. In the case of uncovered components, cap is configured to form a spray chamber in which cooling fluid can be sprayed into thermal contact with, and preferably onto, the chips on the components. The spray mechanism includes an inlet 411 for receiving cooling fluid, preferably in a liquid state. An outlet 413 for liquid and/or gaseous cooling fluid preferably extends from the spray chamber.

Preferably, the cap 405 includes a concave portion having surfaces 415 that form a cavity configured to conformingly adjoin to one or more surfaces of the component-carrying substrate 403 that is both electrically connected to and carrying the components 401 housing the semiconductor devices. Here, the component-carrying substrate and components form a package with which the cap is associated. The component-carrying substrate can be a ceramic platform, a silicon device, a printed circuit board (e.g., an interconnect board), or the like.

When the cavity of the cap conformingly adjoins the component-carrying substrate, the spray chamber 409 is formed, containing at least the portions of the components to be spray cooled. The cap is preferably made of a material having a thermal coefficient of expansion substantially matching that of the component-carrying substrate. Preferably, the cap is retained against the component-carrying substrate by an adhesive, a clamping mechanism, fasteners, or other attachment-type mechanisms, and a seal is formed such that liquid and vapor cooling fluid do not escape the spray chamber other than through designed orifices. The component-carrying substrate is preferably configured to be vapor and liquid tight, but could be configured with a designated orifice, such as an outlet.

The spray mechanisms 407 are configured to spray cooling fluid 417 onto the one or more components 401, which heat and vaporize some, or more preferably all, of the cooling fluid. The cooling fluid vapor that forms during the cooling process is retained in the enclosed spray chamber 409 around the components.

Preferably, the spray mechanisms 407 are incremental sprayers configured to eject an incremental amount of the cooling fluid on the components. A preferred type of incremental sprayer for the spray mechanism 105 is an inkjet-type sprayer. The cooling fluid is typically sprayed in response to an energizing control signal, which is sent to the sprayers by a controller. The quantity of liquid sprayed from incremental sprayers can be highly controllable, such as by controlling the rate at which incremental amounts of cooling fluid are ejected.

Without repeating all the details of the first two embodiments, it should be understood that this embodiment incorporates many features of the first two embodiments. For example, contacts, preferably located on an exterior of the cap, electrically connect the sprayer(s) to a controller that controls the operation of the sprayers. Likewise, the cap can be attached by any of a variety of devices as is appropriate to the limitations of the component's design. It should also be noted that components of the first second and third embodiments can be combined in the same electronic device, and can be run using a common reservoir and/or condenser.

Figure 6:
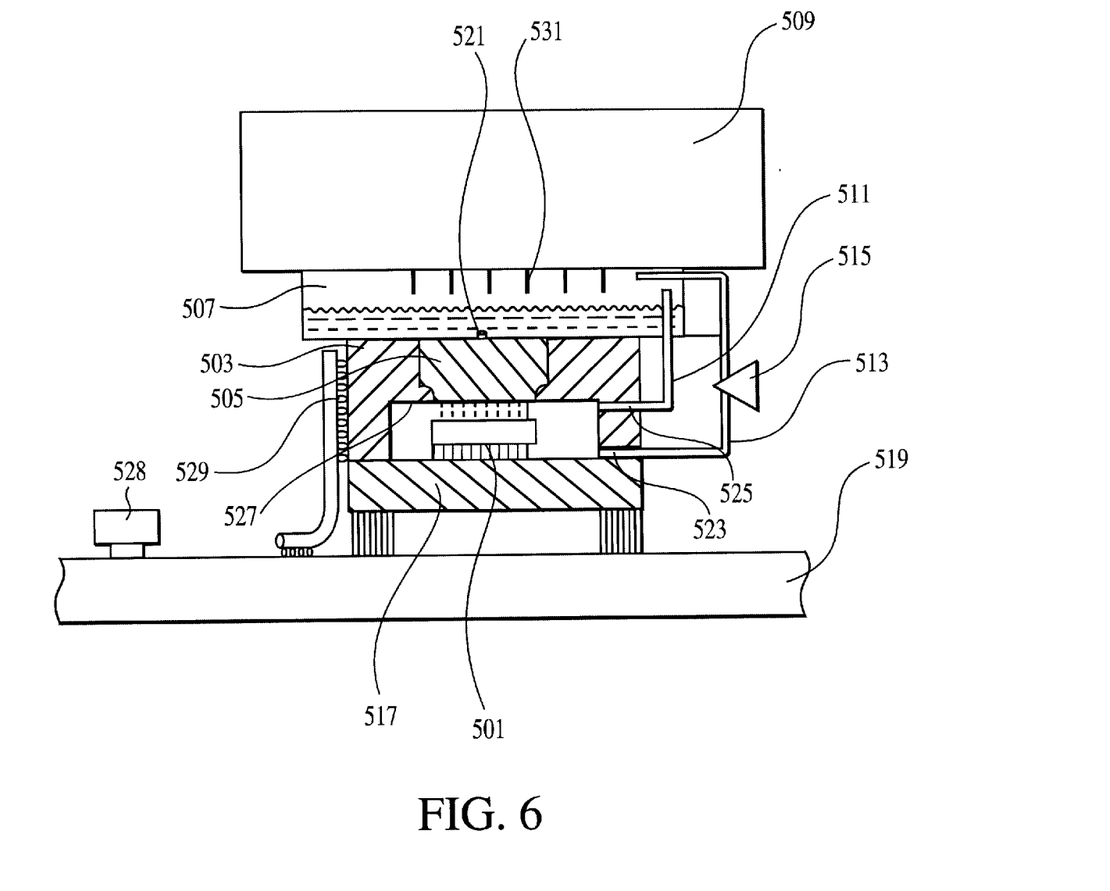
FIG. 6 is a cross-sectional view of a fourth cooling system embodying the invention.

With reference to FIG. 6, a fourth embodiment of a cooling system for cooling one or more heat-generating chips 501, bears substantial similarities to the first embodiment. In the fourth embodiment, the cooling system includes a body forming a cooling cap 503, a spray mechanism 505, a reservoir 507, a heat sink 509, a vapor recovery line 511, a liquid recovery line 513, and a pump 515. The cap, spray mechanism and reservoir are preferably integrated into a single cooling assembly, some or all of which can be unitary. The cap is configured to form a spray chamber in which cooling fluid can be sprayed into thermal contact with, and preferably onto, the chip(s), which are mounted and carried on a component substrate 517, forming a package, which is in turn mounted and carried on a printed circuit board 519.

The spray mechanism 505 includes an inlet 521 for receiving cooling fluid, preferably in a liquid state. Two outlets 523 and 525 for liquid and gaseous cooling fluid recovery, respectively, preferably extend from the spray chamber to the liquid recovery line and vapor recovery line, respectively. This cooling assembly preferably provides a fully integrated, module-level spray-cooling system that resides, and operates locally on single or multiple uncovered chips 501.

Preferably, the cap 503 includes a concave portion having surfaces 527 that form a cavity configured to conformingly adjoin to one or more surfaces of the component substrate 517. When the cavity of the cap conformingly adjoins the component substrate, the spray chamber is formed, containing (or bordering on) at least the portions of the component to be spray cooled. The cap is preferably made of a material having a thermal coefficient of expansion substantially matching that of the component substrate. Preferably, the cap is retained against the component substrate by an adhesive, a clamping mechanism, fasteners, or other attachment-type mechanisms, and a seal is formed such that liquid and vapor cooling fluid do not escape the spray chamber other than through designed orifices.

Preferably, the spray mechanism 505 is an incremental sprayer configured to eject an incremental amount of the cooling fluid on the heat source. The cooling fluid is typically sprayed in response to an energizing control signal, which is sent to the sprayer by a controller 528. As discussed above, a preferred type of incremental sprayer for the spray mechanism is an inkjet-type sprayer in the form of a TIJ sprayer head.

The computerized controller is electrically connected to the heater via a plurality of contacts 529, preferably being mounted on the side of the cap with respect to gravity to leave the top open for use by the reservoir. The contacts are preferably integrated in the cap and exposed on its exterior. As noted in previous embodiments, the incremental amount of the fluid sprayed from the sprayer could be in the form of a single droplet, or in the form of multiple droplets. The incremental sprayers can alternatively be based on other types of ink-jet droplet expelling technology, such as piezo-electric technology.

Typically, this embodiment will include a plurality of sprayers, each of which can be run at different rates depending on the heat dissipation requirements of the portion of the component that it sprays. The cooling cap can also be used with a component substrate that caries a variety of different chips. One or more sprayers can be associated with each chip, and can be individually controlled to operate at rates that depend on the heat production of each portion of each individual chip.

The reservoir 507 is a container that adjoins and preferably is integral with the cap 503 and/or the TIJ sprayer head 505, and is preferably located above it with respect to gravity to assist the feeding of the sprayers. However, other orientations are also within the scope of the invention. The inlet 521 can be designed as a simple passage between the reservoir and the sprayer 505. Both capillary forces and gravity help feed the cooling fluid to the sprayer nozzles. Preferably the TIJ sprayer head includes a manifold that draws the fluid from the reservoir, which can be integrally formed in the bottom of the condenser.

The reservoir 507 preferably also serves as a condenser. The heat transfer from the condenser to the surrounding, ambient conditions preferably occurs through the heat sink 509, which is an air-cooled heat sink, and is mounted to the condenser (reservoir). The heat sink may also be a liquid cold-plate or a refrigerated cold-plate. Embodiments of the invention preferably provide a fully contained package with high performance spray cooling system that can utilize any heat sink option available.

The reservoir is roughened internally, or includes fins 531 to increase its internal surface area and thus improve its ability to channel heat from the cooling fluid to the heat sink. In alternative embodiments, a separate condenser can be used, where the heat sink adjoins the condenser and a passage exists to transfer cooling fluid from the condenser to the reservoir.

The outlet for liquid cooling fluid recovery 523 is preferably low in the spray chamber with respect to gravity, and leads into the liquid recovery line 513. The liquid recovery line passes through the pump 515, which is configured to pump liquid cooling fluid up the liquid recovery line into the reservoir/condenser 507. Preferably the pump is self priming to remove trapped gas. The pump is preferably a micropump, being a low head, low flow pump. Potential vendors for the pump include PAR Technologies, Inc. The liquid recovery line preferably expels liquid cooling fluid into the reservoir at a location above the anticipated level of liquid cooling fluid, thereby making it pour or spray through vapor in the reservoir.

The outlet for vapor cooling fluid recovery 525 is preferably higher in the spray chamber with respect to gravity than the outlet for liquid cooling fluid recovery 523, and leads into the vapor recovery line 511. Preferably the vapor recovery line expels vaporized cooling fluid into the reservoir 507 at a location above the anticipated level of liquid cooling fluid, thereby avoiding fluid pouring down through the vapor recovery line. However, alternate embodiments might be configured to have the vapor bubble up through the liquid cooling fluid in the reservoir, using pumps, valves or the vapor flow itself to avoid cooling fluid pouring down through the vapor recovery line.

Without repeating the details of the first embodiment, it should be understood that this embodiment incorporates most features of the first embodiment. For example, the controller can be based in the semiconductor device(s) that are being cooled, or can be external.

As noted with the previous embodiments, there can be numerous variations in the formation of this embodiment. For example, the package can be formed such that the chip is directly spray cooled with an inert dielectric fluid, or it can be indirectly cooled via an intermediate substance. Additionally, the spray cooling system can have an integrated TIJ sprayer head (i.e., it is permanently formed in the cap during the manufacturing process), or it can be separately added, and possibly be removable and replaceable in a modular form. Furthermore, additional inlets and/or outlets and pumps can be used.

A fifth and sixth embodiment of the invention can be formed by taking the second and third embodiments of the invention, and incorporating a condenser, heat sink and pump similar to the way the third embodiment is configured as the first embodiment with a condenser, heat sink and pump.

A useful aspect of the fourth through sixth embodiments, is that they form self contained, compact cooling systems that can be universally applicable across various types of heat-producing components in a wide array of products, from servers to workstations and beyond. In upgrading existing devices (such as computer systems), existing components with lower heat dissipation requirements can be upgraded to new, higher-dissipation cooled components that include a variation of the above-described cooling systems without having to add separate condensers and the like.

Generally speaking many embodiments of the invention can be configured to be pressed onto, and develop a watertight seal with, a component carrying device, such as the one depicted in FIG. 5. Alternatively, embodiments of the invention could press directly onto a covered component, or onto a component substrate carrying an uncovered chip. Alternative attachment means, such as using adhesives, are also within the scope of the invention.

The operation of cooling systems in the described embodiments is preferably controlled via a software or hardware controller. The controller can be on a separate part of the overall system, and might control the operation of a plurality of such cooling systems. Alternatively, the controller can be mechanical in nature, or incorporated within a chip that is being cooled by the system.

For inkjet spray cooling systems to function at optimal efficiency, the sprayers' mass flow rate ($\dot{m}_s$) is preferably adjusted to avoid having the semiconductor device become either dry or immersed. This rate is controlled by having a controller adjust the rate that the thermal jets are fired. The optimum mass flow rate can change as the heat flux of the semiconductor device changes. Thus, for a controller to correctly control the mass flow, parameters of the semiconductor device and/or cooling system need to be sensed.

To determine whether the mass flow rate is at an optimal level, sensors can be used to track one or more of the system parameters. The types of parameters that are available vary with the type of system employed. For example, if separate liquid and vapor removal lines are used, the mass flow of the vapor ($\dot{m}_v$) and/or mass flow of the liquid ($\dot{m}_l$) can be sensed. As another example, the vapor pressure within the spray chamber ($P_v$) and the semiconductor device's junction temperature can be sensed.

Furthermore, embodiments of the invention can incorporate various combinations of the spray cooling apparatus described in U.S. Pat. No. 6,205,799, which is incorporated herein by reference for all purposes. For example, the cooling system can use pooling sensors, as are described in the patent. Likewise, a spring mechanism in the reservoir could be used to assist in the feeding of cooling fluid to the sprayers.

It is to be understood that the invention comprises apparatus and methods for designing cooling systems and for producing cooling systems, as well as the apparatus and methods of the cooling system itself. Additionally, the various embodiments of the invention can incorporate various combinations of the features disclosed above in generally discussing an inkjet spray cooling system, and can be designed, made and operated using related methods (or portions thereof) as described above for the inkjet spray cooling system. Alternate variations of these embodiments could comprise other types of incremental spraying mechanisms, such as piezoelectric sprayers, or other spraying mechanisms. In short, the above disclosed features can be combined in a wide variety of configurations within the anticipated scope of the invention.

Furthermore, it is to be understood that cooled components, cooled singly or in groups as described above, can be mounted on circuit boards to form systems including one or more circuit boards carrying one or more cooled components that are electronically interlinked via the circuit boards. Such systems are also within the scope of the invention. Additionally, groups of the cooled components combined with one or more cooling fluid condensers that cool fluid from numerous cooled components are also within the scope of the invention.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A system for cooling a component with a sprayed cooling fluid, comprising:
   a body configured with a cavity to be retained against a portion of the component;
   wherein when the cavity is retained against a portion of the component, the cavity is configured to form a spray chamber in which the cooling fluid can be sprayed into thermal contact with a portion of the component.

2. The system of claim 1, and further comprising a sprayer configured to eject cooling fluid on the component.

3. The system of claim 1, and further comprising an incremental sprayer configured to eject incremental amounts of cooling fluid onto the component in response to a control signal.

4. The system of claim 3, wherein the incremental sprayer is a thermal inkjet head.

5. The system of claim 3, and further comprising a controller configured to transmit a control signal to the incremental sprayer such that the incremental sprayer ejects incremental amounts of cooling fluid at a rate leading to the cooling fluid being vaporized by the component.

6. The system of claim 2, wherein the body defines a reservoir configured to receive cooling fluid from an outlet of the spray chamber, and configured to feed cooling fluid to an inlet of the sprayer.

7. The system of claim 2, wherein the body defines a condenser configured to remove heat from cooling fluid vaporized by heat from the component.

8. The system of claim 7, and further comprising a pump configured to pump cooling fluid from the spray chamber to the condenser.

9. The system of claim 1, and further comprising:
a thermal inkjet head configured to be an incremental sprayer that ejects incremental amounts of the cooling fluid through the spray chamber and onto the component; and
a pump configured to pump cooling fluid from the spray chamber to a reservoir defined by the body, the reservoir being configured with an outlet to feed cooling fluid to the thermal inkjet head;
wherein the body defines a condenser configured to remove heat from cooling fluid that was heated by the component.

10. The system of claim 9, wherein the condenser is integral with the reservoir.

11. The system of claim 9, wherein the pump is configured to pump liquid cooling fluid.

12. The system of claim 9, wherein the body is an integral unit.

13. A cooled component, comprising:
a semiconductor device;
a substrate carrying the semiconductor device;
a cooling fluid for spray cooling the semiconductor device;
a sprayer configured to eject the cooling fluid on the semiconductor device; and
a body configured to be retained against a portion of the substrate;
wherein the body is configured with a cavity that, when retained against a portion of the substrate, forms a spray chamber in which the cooling fluid can be sprayed into thermal contact with the semiconductor device.

14. The system of claim 13, and further comprising an incremental sprayer configured to eject incremental amounts of cooling fluid onto the semiconductor device in response to a control signal.

15. The system of claim 14, wherein the incremental sprayer is a thermal inkjet head.

16. The system of claim 14, and further comprising a controller configured to transmit a control signal to the incremental sprayer such that the incremental sprayer ejects incremental amounts of cooling fluid at a rate leading to the cooling fluid being vaporized by the semiconductor device.

17. The system of claim 13, wherein the body defines a reservoir configured to receive cooling fluid from an outlet of the spray chamber, and configured to feed cooling fluid to an inlet of the sprayer.

18. The system of claim 13, wherein the body defines a condenser configured to remove heat from cooling fluid vaporized by heat from the semiconductor device.

19. The system of claim 18, and further comprising a pump configured to pump cooling fluid from the spray chamber to the condenser.

20. The system of claim 13, and further comprising:
an incremental sprayer configured to eject incremental amounts of cooling fluid onto the semiconductor device in response to a control signal, wherein the incremental sprayer is a thermal inkjet head; and
a pump configured to pump cooling fluid from the spray chamber to a condenser defined by the body, the condenser configured to remove heat from cooling fluid vaporized by heat from the semiconductor device;
wherein the body defines a reservoir configured to receive cooling fluid from an outlet of the spray chamber, and configured to feed cooling fluid to an inlet of the sprayer.

21. A circuit board system, comprising
a circuit board; and
a cooled component of claim 13, the cooled component being mounted on the circuit board.

22. The system of claim 21, each component further comprising:
a pump configured to pump cooling fluid from the spray chamber to a condenser defined by the body, the condenser configured to remove heat from cooling fluid vaporized by heat from the semiconductor device;
wherein the sprayer of each cooled component is a thermal inkjet head configured to eject incremental amounts of cooling fluid onto the semiconductor; and
wherein the body of each cooled component defines a reservoir configured to receive cooling fluid from an outlet of the spray chamber, and configured to feed cooling fluid to an inlet of the sprayer of each cooled component.

23. A circuit board system, comprising:
a plurality of circuit boards; and
a plurality of the cooled components of claim 13, the plurality of cooled components being mounted on the plurality of circuit boards;
wherein the plurality of cooled components are electrically interconnected via at least one of the plurality of circuit boards.

24. The circuit board system of claim 23, each cooled component further comprising:
a pump configured to pump cooling fluid from the spray chamber to a condenser defined by the body, the condenser configured to remove heat from cooling fluid vaporized by heat from the semiconductor device;
wherein the sprayer of each cooled component is a thermal inkjet head configured to eject incremental amounts of cooling fluid onto the semiconductor; and
wherein the body defines a reservoir configured to receive cooling fluid from an outlet of the spray chamber, and configured to feed cooling fluid to an inlet of the sprayer.

25. A method for cooling a component with a sprayed cooling fluid, comprising:
adjoining a cavity of a body against a portion of the component, wherein when the cavity is retained against a portion of the component, the cavity is configured to form a spray chamber in which the cooling fluid can be sprayed into thermal contact with a portion of the component; and
spraying the cooling fluid onto the portion of the component.

26. The method of claim 25, wherein the cooling fluid is sprayed onto the portion of the component by an incremental sprayer configured to eject incremental amounts of cooling fluid onto the semiconductor device in response to a control signal, the step of spraying comprising:

signaling the incremental sprayer to eject incremental amounts of cooling fluid onto the semiconductor device at a desired frequency.

27. The method of claim 26, wherein:

the incremental sprayer comprises a body defining a ejection chamber configured to hold a volume of the cooling fluid, the body further defining an orifice in communication with the ejection chamber, and the incremental sprayer further comprises a heating element in thermal communication with the ejection chamber, the heating element being configured to vaporize a portion of the cooling fluid held within the ejection chamber, and the orifice being configured to direct cooling fluid from the ejection chamber to the heat source upon the heating element vaporizing a portion of the cooling fluid held within the ejection chamber; and in the step of spraying, the heating element vaporizes a portion of the cooling fluid held within the ejection chamber in response to the incremental sprayer being signaled, thereby causing cooling fluid to be directed from the ejection chamber to the semiconductor device.

28. The method of claim 25, wherein the body defines a reservoir configured to receive cooling fluid from an outlet of the spray chamber, and configured to feed cooling fluid to a sprayer that is used in the step of spraying, and further comprising pumping the cooling fluid such that it flows from the spray chamber to the reservoir.

29. The cooled component of claim 13, wherein the substrate is a printed circuit board.

* * * * *